United States Patent
Peng et al.

(10) Patent No.: US 8,755,184 B2
(45) Date of Patent: Jun. 17, 2014

(54) CONTAINER DATA CENTER

(75) Inventors: Yonghui Peng, Shenzhen (CN); Jun Zhao, Shenzhen (CN); Na Wei, Shenzhen (CN); Mingliang Hao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 334 days.

(21) Appl. No.: 13/337,545

(22) Filed: Dec. 27, 2011

(65) Prior Publication Data

US 2012/0134107 A1 May 31, 2012

Related U.S. Application Data

(63) Continuation of application No. PCT/CN2011/074158, filed on May 17, 2011.

(30) Foreign Application Priority Data

Nov. 17, 2010 (CN) .......................... 2010 1 0553715

(51) Int. Cl.
*H05K 7/20* (2006.01)

(52) U.S. Cl.
USPC ................. 361/699; 361/679.46; 361/679.53; 361/689; 361/696; 62/259.2

(58) Field of Classification Search
None
See application file for complete search history.

(56) References Cited

U.S. PATENT DOCUMENTS

| 7,297,015 | B1 | 11/2007 | Desrosiers et al. | |
|---|---|---|---|---|
| 7,511,960 | B2 * | 3/2009 | Hillis et al. | 361/702 |
| 7,551,971 | B2 * | 6/2009 | Hillis | 700/90 |
| 7,684,193 | B2 * | 3/2010 | Fink et al. | 361/695 |
| 7,852,627 | B2 * | 12/2010 | Schmitt et al. | 361/695 |
| 7,961,463 | B2 * | 6/2011 | Belady et al. | 361/695 |
| 7,971,446 | B2 * | 7/2011 | Clidaras et al. | 62/259.2 |
| 8,031,468 | B2 * | 10/2011 | Bean et al. | 361/696 |
| 8,295,047 | B1 * | 10/2012 | Hamburgen et al. | 361/699 |
| 8,310,829 | B2 * | 11/2012 | Monk et al. | 361/696 |
| 8,434,804 | B2 * | 5/2013 | Slessman | 296/24.3 |
| 8,514,572 | B2 * | 8/2013 | Rogers | 361/695 |

(Continued)

FOREIGN PATENT DOCUMENTS

| CN | 2548392 | 4/2003 |
|---|---|---|
| CN | 1464770 | 12/2003 |

(Continued)

OTHER PUBLICATIONS

Partial translation of Office Action dated Jul. 15, 2013 in connection with Chinese Patent Application No. 201010553715.1.

(Continued)

*Primary Examiner* — Boris Chervinsky

(57) ABSTRACT

A container data center is disclosed in the present invention, relating to the field of data centers. The container data center includes: a container box, in which the inside of the box is divided into an equipment compartment, a power supply and distribution compartment and a water chilling set compartment; doors set in the box; a power supply equipment installed in the power supply and distribution compartment; an electronic equipment and a water chilling terminal installed in the equipment compartment; a water chilling set installed in the water chilling set compartment, in which the water chilling set is in communication with the water chilling terminal to provide cold water for the water chilling terminal.

11 Claims, 3 Drawing Sheets

(56) References Cited

U.S. PATENT DOCUMENTS

| | | |
|---|---|---|
| 2009/0021907 A1 | 1/2009 | Mann et al. |
| 2009/0225513 A1 | 9/2009 | Correa et al. |
| 2010/0277863 A1 | 11/2010 | Tozer et al. |

FOREIGN PATENT DOCUMENTS

| | | |
|---|---|---|
| CN | 101755248 A | 6/2010 |
| CN | 101844655 | 9/2010 |
| JP | 2009-31557 | 2/2009 |
| WO | WO 2008/133101 A1 | 11/2008 |

OTHER PUBLICATIONS

Written Opinion of the International Searching Authority dated Aug. 4, 2011 in connection with International Patent Application No. PCT/CN2011/074158.

First Chinese Office Action (Partial Translation) for Application No. 201010553715.1; mailed Feb. 24, 2012 (Chinese version attached).

Translation of Office Action dated Nov. 13, 2012 in connection with Chinese Patent Application No. 201010553715.1.

* cited by examiner

CONTAINER DATA CENTER

CROSS-REFERENCE TO RELATED APPLICATIONS

This application is a continuation of International Application No. PCT/CN2011/074158, filed on May 17, 2011, which claims priority to Chinese Patent Application No. 201010553715.1, filed on Nov. 17, 2010, both of which are hereby incorporated by reference in their entireties.

FIELD OF THE INVENTION

The present invention relates to the field of data centers, and in particular, to a container data center.

BACKGROUND OF THE INVENTION

As a low cost, high energy efficient, flexible and rapidly deployable data center, a container data center has been gradually used by main equipment manufacturers.

The infrastructure of a box-type data center includes a container box. The inside of the container box is divided into an equipment zone and a power supply and distribution zone. A cabinet is installed in the equipment zone, and a data equipment is installed inside the cabinet. A power supply and distribution equipment is installed in the power supply and distribution zone. The power supply and distribution equipment includes an uninterruptible power supply, a power distribution cabinet and a power generator. In both the equipment zone and the power supply and distribution zone, one or more equipments selected from the group of an air conditioner, a fire alarm, a fire fighting facility, and a security monitoring equipment are installed. A partition board is set between the equipment zone and the power supply and distribution zone. A door is provided on the partition board.

The box-type data center adopts the two-compartment design, and only requisite facilities of the data center are combined. In the box-type data center, a common precision air conditioner is used for cooling. The air conditioner has a small cooling capacity, so that the cooling requirement of the data center in a case of large power consumption cannot be satisfied. Therefore, a cooling equipment needs to be additionally deployed, so that the box-type data center is incapable of being used upon arrival, and fast deployment and emergency allocation of the box-type data center cannot be achieved.

SUMMARY OF THE INVENTION

In order to achieve fast deployment and emergency allocation of a container data center, so that the container data center may be used as soon as arriving without the need of additionally deploying a cooling equipment, an embodiment of the present invention provides a container data center, which includes:
 a container box, inside of the box is divided into an equipment compartment, a power supply and distribution compartment and a water chilling set compartment;
 doors set in the box;
 a power supply equipment installed in the power supply and distribution compartment;
 an electronic equipment and a water chilling terminal installed in the equipment compartment; and
 a water chilling set installed in the water chilling set compartment and communicated with the water chilling terminal to provide cold water for the water chilling terminal.

Through the technical solutions provided in the embodiments of the present disclosure, the full layout of the equipment compartment, the power supply and distribution compartment and the water chilling set compartment is accomplished in a single box, which satisfies the cooling requirement of the inside of the container data center without the need of additionally deploying a cooling equipment, and saves the time for infrastructure construction, so that the container data center may be used upon arrival and fast deployment and emergency allocation of the container data center are achieved.

BRIEF DESCRIPTION OF THE DRAWINGS

To illustrate the technical solutions according to the embodiments of the present disclosure more clearly, the accompanying drawings for describing the embodiments are introduced briefly in the following. Apparently, the accompanying drawings in the following description are only some embodiments of the present invention, and persons of ordinary skill in the art may derive other drawings from the accompanying drawings without creative efforts.

DETAILED DESCRIPTION OF THE EMBODIMENTS

In order to make the objectives, technical solutions, and advantages of the present invention more comprehensible, the implementation of the present invention is described in further detail below with reference to the accompanying drawings.

Embodiment 1

Figure 1:
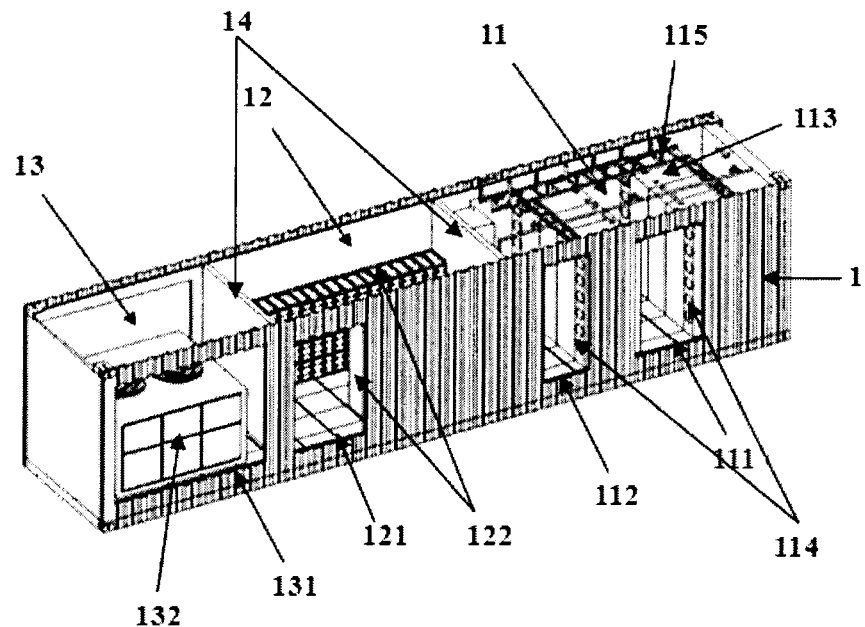
FIG. 1 is an isometric view of a container data center according to embodiment 1 of the present invention.

An embodiment of the present invention provides a container data center, referring to FIG. 1, which includes:
 a container box 1, in which the inside of the box 1 is divided into an equipment compartment 11, a power supply and distribution compartment 12 and a water chilling set compartment 13; a door 111, a door 112, a door 121 and a door 131 set in the box 1; an electronic equipment 113 and a water chilling terminal 114 installed in the equipment compartment 11; a power supply equipment 122 installed in the power supply and distribution compartment 12; and a water chilling set 132 installed in the water chilling set compartment 13 and communicated with the water chilling terminal 114 to provide cold water for the water chilling terminal 114.

The container data center according to the embodiment of the present invention accomplishes the full layout of the equipment compartment, the power supply and distribution compartment and the water chilling set compartment in a single box, which satisfies the cooling requirement inside of the container data center without the need of additionally deploying a cooling equipment, and saves the time-consumption for infrastructure construction, so that the container data center may be used as soon as arriving and fast deployment and emergency allocation of the container data center are achieved.

Embodiment 2

Figure 2:
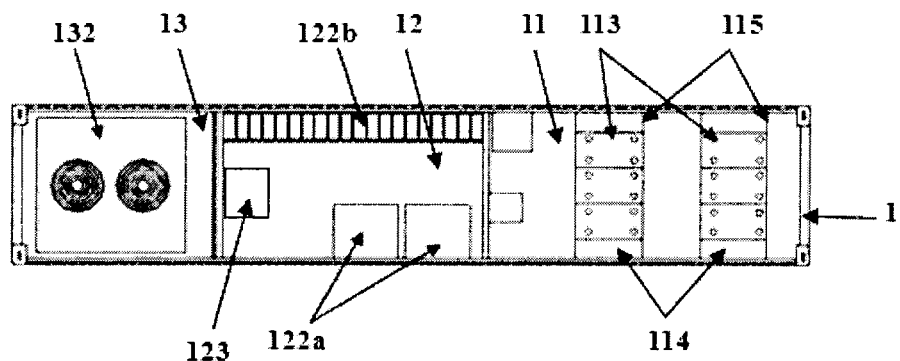
FIG. 2 is a top view of a first container data center according to embodiment 2 of the present invention.

An embodiment of the present invention provides a container data center, referring to FIG. 1 and FIG. 2 simultaneously, which includes the following.

The inside of a container box 1 is divided into an equipment compartment 11, a power supply and distribution compartment 12 and a water chilling set compartment 13. The power supply and distribution compartment 12 is located in the middle of the box 1, the equipment compartment 11 is located on the right of the power supply and distribution compartment 12, and the water chilling set compartment 13 is located on the left of the power supply and distribution compartment 12. A door 111, a door 112, a door 121 and a door 131 are respectively set in the equipment compartment 11, the power supply and distribution compartment 12 and the water chilling set compartment 13 in the box 1 for access. Each of the compartments may have a door set in. For example, a door 121 is set in the power supply and distribution compartment 12 and a door 131 is set in the water chilling set compartment 13. Alternatively, each of the compartments may have a plurality of doors set in for access. For example, on the equipment compartment 11, a door may be set between every two rows of electronic racks 115 and a door may be set between an electronic rack 115 and a compartment wall, referring to the door 111 and the door 112 in FIG. 1.

An electronic equipment 113 and a water chilling terminal 114 are installed in the equipment compartment 11. The electronic equipment 113 is installed on an electronic rack 115, and the electronic racks 115 are perpendicular to long sides of the box 1 and arranged in parallel with each other. A width of the electronic rack 115 may be in a range of 500 mm to 600 mm, and may also be other sizes. In this embodiment of the present invention, the width of the electronic rack 115 being 550 mm is merely taken as an example for illustration; however, it cannot be considered as a limitation of the present invention. The water chilling terminal 114 is placed at the bottom or top of the equipment compartment 11, or on a side of the electronic rack 115 for cooling the equipment compartment 11 to lower the temperature in the equipment compartment 11.

The power supply equipment 122 is installed in the power supply and distribution compartment 12 for providing uninterruptible power for the equipment compartment 11 and the water chilling set compartment 13. The power supply equipment 122 includes a UPS (Uninterruptible Power Supply) 122a and a battery 122b, and may also include other power supply equipments, which is not specifically limited in this embodiment of the present invention. A water chilling terminal 123 may be further installed in the power supply and distribution compartment 12, and is placed at the bottom or top of the power supply and distribution compartment 12, or on a side of the power supply equipment 122 for cooling the power supply and distribution compartment 12 to lower the temperature in the power supply and distribution compartment 12, and alternatively, the water chilling terminal 123 may not be installed. In this embodiment of the present invention, only that the water chilling terminal 123 is installed is taken as an example for illustration; however, the present invention is not limited thereto.

Figure 3:
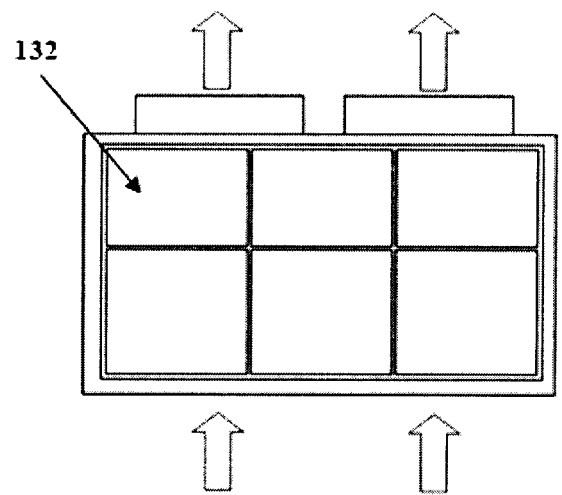
FIG. 3 is a schematic diagram of air ducts of a water chilling set of the first container data center according to embodiment 2 of the present invention.
Figure 4:
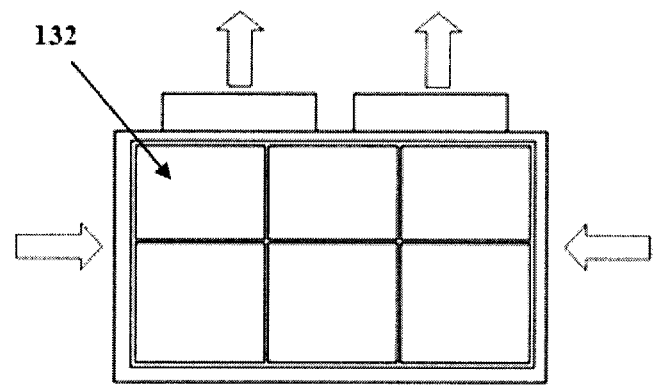
FIG. 4 is a schematic diagram of air ducts of a water chilling set of a second container data center according to embodiment 2 of the present invention.
Figure 5:
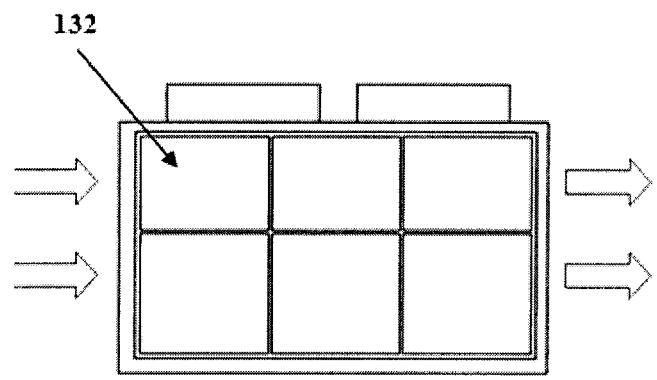
FIG. 5 is a schematic diagram of air ducts of a water chilling set of a third container data center according to embodiment 2 of the present invention.

The water chilling set 132 is installed in the water chilling set compartment 13. In this embodiment of the present invention, the type of water chilling set 132 is not specifically limited, and an air-cooled water chilling set or a water-cooled water chilling set may be adopted instead. The water chilling set 132 is in communication with the water chilling terminal 114 placed in the equipment compartment 11 and the water chilling terminal 123 placed in the power supply and distribution compartment 12, for cooling by providing cold water to the water chilling terminal 114 and the water chilling terminal 123 and lowering the temperature of the water that flows back from the water chilling terminal 114 and the water chilling terminal 123. FIG. 3 is a schematic diagram of air ducts of the water chilling set 132. The air ducts of the water chilling set 132 adopt an air duct structure including an air inlet that is set in the bottom wall and an air outlet that is set in the top wall for ventilation of air to lower the temperature of the water chilling set 132, and a box wall without a vent is sealed to isolate noises. Referring to FIG. 4 and FIG. 5, the air duct structure of the water chilling set 132 is not specifically limited in the embodiment of the present invention, and an air duct structure including an air inlet that is set in a sidewall and an air outlet that is set in a top wall or an air duct structure including an air inlet that is set in a sidewall and an air outlet that is set in a sidewall may be adopted instead.

Figure 6:
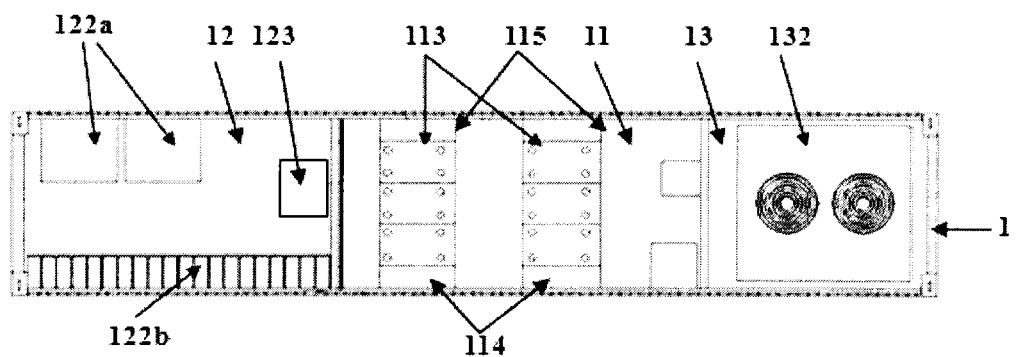
FIG. 6 is a top view of the second container data center according to embodiment 2 of the present invention.
Figure 7:
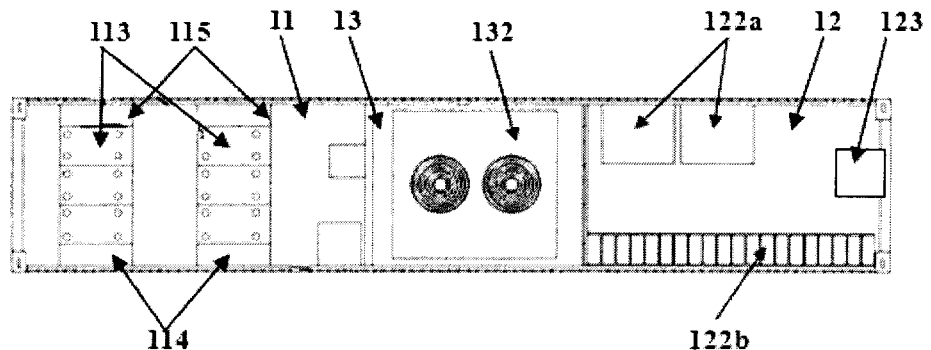
FIG. 7 is a top view of the third container data center according to embodiment 2 of the present invention.

Specifically, the positions of the equipment compartment 11, the power supply and distribution compartment 12 and the water chilling set compartment 13 in the container box 1 may be randomly arranged, and are not specifically limited in the embodiment of the present invention. As shown in FIG. 2, the power supply and distribution compartment 12 is located in the middle, and the equipment compartment 11 and the water chilling set compartment 13 are located on two sides. Alternatively, as shown in FIG. 6, the equipment compartment 11 is located in the middle, and the power supply and distribution compartment 12 and the water chilling set compartment 13 are located on two sides. Alternatively, as shown in FIG. 7, the water chilling set compartment 13 is located in the middle, and the equipment compartment 11 and the power supply and distribution compartment 12 are located on two sides. The power supply and distribution compartment 12 provides uninterrupted power for the equipment compartment 11 and the water chilling set compartment 13, and the water chilling set compartment 13 cools the equipment compartment 11 and the power supply and distribution compartment 12.

Furthermore, referring to FIG. 1, the adjacent compartments among the equipment compartment 11, the power supply and distribution compartment 12 and the water chilling set compartment 13 are separated by using a partition board 14, and the partition board 14 has a door or otherwise has no door. In this embodiment of the present invention, only that the partition board 14 has no door is taken as an example for illustration; however, the present invention is not limited thereto.

In addition, one or more of a fire alarm, a fire fighting facility and a security monitoring equipment may be further set in the equipment compartment 11, the power supply and distribution compartment 12 and the water chilling set compartment 13.

In conclusion, the container data center according to the embodiments of the present invention accomplishes the full layout of the equipment compartment, the power supply and distribution compartment and the water chilling set compartment in a single box, which satisfies the cooling requirement of the inside of the container data center without the need of additionally deploying a cooling equipment and saves the time for infrastructure construction, so that the container data center may be used upon arrival and fast deployment and emergency allocation of the container data center are achieved. In addition, when 550-mm-wide electronic racks are adopted and are perpendicular to a long side of the equipment compartment and arranged in parallel, the arrangement density of the electronic racks is higher, so that more electronic equipments may be installed and the space of the container data center may be more fully utilized.

The above descriptions are merely exemplary embodiments of the present invention, but not intended to limit the present invention. Any modification, equivalent replacement, and improvement made without departing from the spirit and principle of the present invention shall fall within the protection scope of the present invention.

What is claimed is:

1. A container data center, comprising:
    a container box, wherein the inside of the box is divided into an equipment compartment, a power supply and distribution compartment and a water chilling set compartment;
    doors set in the box;
    a power supply equipment installed in the power supply and distribution compartment;
    an electronic equipment and a water chilling terminal installed in the equipment compartment; and
    a water chilling set installed in the water chilling set compartment, wherein the water chilling set communicates with the water chilling terminal to provide cold water for the water chilling terminal.

2. The data center according to claim 1, wherein each of the equipment compartment, the power supply and distribution compartment and the water chilling set compartment has a door for access, and each of the compartments has at least one door set in.

3. The data center according to claim 1, wherein the electronic equipment is installed on an electronic rack.

4. The data center according to claim 3, wherein, the electronic racks are perpendicular to a long side of the box and arranged in parallel with each other.

5. The data center according to claim 3, wherein the electronic rack has a width range of 500 mm to 600 mm.

6. The data center according to claim 1, wherein the water chilling terminal is placed on a bottom or a top of the equipment compartment, or on a side of an electronic rack.

7. The data center according to claim 1, wherein the power supply equipment comprises an uninterruptible power supply and a battery.

8. The data center according to claim 1, wherein a water chilling terminal is further installed in the power supply and distribution compartment, and the water chilling terminal is communicated with the water chilling set and is placed on a bottom or a top of the power supply and distribution compartment, or on a side of the power supply equipment.

9. The data center according to claim 1, wherein a box-wall of the water chilling set, wherein the box-wall that has no vent is sealed, and any one of an air duct structure comprising an air inlet that is set in a bottom wall and an air outlet that is set in a top wall, an air duct structure comprising an air inlet that is set in a sidewall and an air outlet that is set in a top wall, and an air duct structure comprising an air inlet that is set in a sidewall and an air outlet that is set in a sidewall is adopted.

10. The data center according to claim 1, wherein positions of the equipment compartment, the power supply and distribution compartment and the water chilling set compartment are randomly arranged, wherein any one of arrangement manners that the power supply and distribution compartment is located in the middle and the other compartments are set on two sides, that the equipment compartment is placed in the middle and the other compartments are placed on two sides, and that the water chilling set compartment is located in the middle and the other compartments are placed on two sides is adopted, adjacent compartments are separated by using a partition board, and the partition board has a door or has no door.

11. The data center according to claim 1, wherein the equipment compartment, the power supply and distribution compartment and the water chilling set compartment further comprise:
    one or more of a fire alarm, a fire fighting facility, and a security monitoring equipment.

* * * * *